(12) United States Patent  (10) Patent No.: US 7,299,168 B2
Rappaport et al.  (45) Date of Patent: **\*Nov. 20, 2007**

(54) SYSTEM FOR THE THREE-DIMENSIONAL DISPLAY OF WIRELESS COMMUNICATION SYSTEM PERFORMANCE

(75) Inventors: Theodore S. Rappaport, Blacksburg, VA (US); Roger R. Skidmore, Blacksburg, VA (US)

(73) Assignee: Wireless Valley Communications, Inc., Austin, TX (US)

( * ) Notice: Subject to any disclaimer, the term of this patent is extended or adjusted under 35 U.S.C. 154(b) by 768 days.

This patent is subject to a terminal disclaimer.

(21) Appl. No.: 10/244,409

(22) Filed: Sep. 17, 2002

(65) Prior Publication Data

US 2003/0014233 A1  Jan. 16, 2003

(51) Int. Cl.
*G06F 17/50* (2006.01)
*H04B 17/00* (2006.01)
*H04Q 7/36* (2006.01)

(52) U.S. Cl. .......................... 703/20; 703/5; 455/33.1; 455/33.4; 455/56.1; 345/133

(58) Field of Classification Search .................... 703/2, 703/20, 5; 455/441, 446, 448, 33.1–33.4; 370/252; 345/56.1
See application file for complete search history.

(56) References Cited

U.S. PATENT DOCUMENTS

| | | | |
|---|---|---|---|
| 4,675,147 A | 6/1987 | Schaefer et al. | |
| 4,736,453 A | 4/1988 | Schloemer | |
| 4,885,694 A | 12/1989 | Pray et al. | |
| 5,111,392 A | 5/1992 | Malin | |
| 5,119,307 A | 6/1992 | Blaha et al. | |
| 5,239,487 A | 8/1993 | Horejsi et al. | |
| 5,293,640 A | 3/1994 | Gunmar et al. | |
| 5,307,261 A | 4/1994 | Maki et al. | |
| 5,337,149 A | 8/1994 | Kozah et al. | |
| 5,339,184 A | 8/1994 | Tang | |
| 5,375,123 A | 12/1994 | Andersson et al. | |
| 5,394,522 A | 2/1995 | Sanchez-Frank et al. | |
| 5,450,615 A | 9/1995 | Fortune et al. | |
| 5,458,123 A | 10/1995 | Unger | |
| 5,465,390 A | 11/1995 | Cohen | |
| 5,467,441 A | 11/1995 | Stone et al. | |
| 5,482,050 A | 1/1996 | Smokoff et al. | |
| 5,485,568 A | 1/1996 | Venable et al. | |

(Continued)

OTHER PUBLICATIONS

P. Bahl, V. Padmanabhan, and A. Balachandran, "A Software System for Locating Mobile Users: Design, Evaluation, and Lessons," Microsoft Technical Report, Apr. 2000.

(Continued)

*Primary Examiner*—Thai Phan

(57) ABSTRACT

A method for displaying the results of predicted wireless communication system performance as a three-dimensional region of fluctuating elevation and/or color within a three-dimensional computer drawing database consisting of one or more multi-level buildings, terrain, flora, and additional static and dynamic obstacles (e.g., automobiles, people, filing cabinets, etc.). The method combines computerized organization, database fusion, and site-specific performance prediction models. The method enables a design engineer to visualize the performance of any wireless communication system as a three-dimensional region of fluctuating elevation, color, or other aesthetic characteristics with fully selectable display parameters, overlaid with the three-dimensional site-specific computer model for which the performance prediction was carried out.

89 Claims, 9 Drawing Sheets

U.S. PATENT DOCUMENTS

| | | | |
|---|---|---|---|
| 5,491,644 A | 2/1996 | Pickering et al. | |
| 5,491,837 A | 2/1996 | Haartsen | |
| 5,493,679 A | 2/1996 | Virgil et al. | |
| 5,515,269 A | 5/1996 | Willis et al. | |
| 5,528,518 A | 6/1996 | Bradshaw et al. | |
| 5,539,665 A | 7/1996 | Lamming et al. | |
| 5,553,312 A | 9/1996 | Gattey et al. | |
| 5,553,620 A | 9/1996 | Snider et al. | |
| 5,555,354 A | 9/1996 | Strasnick et al. | |
| 5,561,841 A | 10/1996 | Markus | |
| 5,564,070 A | 10/1996 | Want et al. | |
| 5,586,254 A | 12/1996 | Kondo | |
| 5,594,946 A | 1/1997 | Menich et al. | |
| 5,598,532 A | 1/1997 | Liron | |
| 5,608,854 A * | 3/1997 | Labedz et al. | 345/441 |
| 5,625,827 A | 4/1997 | Krause et al. | |
| 5,636,344 A | 6/1997 | Lewis | |
| 5,689,355 A | 11/1997 | Okubo et al. | |
| 5,710,758 A | 1/1998 | Soliman et al. | |
| 5,755,072 A | 5/1998 | Lingafelter | |
| 5,761,093 A | 6/1998 | Urbish et al. | |
| 5,774,669 A | 6/1998 | George et al. | |
| 5,794,128 A | 8/1998 | Brockel et al. | |
| 5,799,154 A | 8/1998 | Kuriyan | |
| 5,802,146 A | 9/1998 | Dulman | |
| 5,809,282 A | 9/1998 | Cooper et al. | |
| 5,815,395 A | 9/1998 | Hart et al. | |
| 5,821,937 A | 10/1998 | Tonelli et al. | |
| 5,825,759 A | 10/1998 | Liu | |
| 5,828,960 A | 10/1998 | Tang et al. | |
| 5,831,610 A | 11/1998 | Tonelli et al. | |
| 5,832,389 A | 11/1998 | Dent | |
| 5,845,124 A | 12/1998 | Berman | |
| 5,859,839 A * | 1/1999 | Ahlenius et al. | 370/252 |
| 5,861,887 A | 1/1999 | Butler et al. | |
| 5,867,112 A | 2/1999 | Kost | |
| 5,877,777 A | 3/1999 | Colwell | |
| 5,878,328 A | 3/1999 | Chawla et al. | |
| 5,907,850 A | 5/1999 | Krause et al. | |
| 5,917,808 A | 6/1999 | Kosbab | |
| 5,923,850 A | 7/1999 | Barroux | |
| 5,926,762 A | 7/1999 | Arpee et al. | |
| 5,940,196 A | 8/1999 | Piehler et al. | |
| 5,945,976 A | 8/1999 | Iwamura et al. | |
| 5,948,055 A | 9/1999 | Pulsipher et al. | |
| 5,949,335 A | 9/1999 | Maynard | |
| 5,949,988 A | 9/1999 | Feisullin et al. | |
| 5,953,669 A * | 9/1999 | Stratis et al. | 455/449 |
| 5,963,867 A | 10/1999 | Reynolds et al. | |
| 5,970,406 A | 10/1999 | Komara | |
| 5,977,851 A | 11/1999 | Stancil et al. | |
| 5,987,328 A | 11/1999 | Ephremides et al. | |
| 5,994,984 A | 11/1999 | Stancil et al. | |
| 6,006,021 A | 12/1999 | Tognazzini | |
| 6,014,565 A * | 1/2000 | Bonta | 455/437 |
| 6,018,625 A | 1/2000 | Hayball et al. | |
| 6,021,316 A | 2/2000 | Heiska et al. | |
| 6,032,105 A | 2/2000 | Lee et al. | |
| 6,038,547 A | 3/2000 | Casto | |
| 6,044,273 A | 3/2000 | Tekinay | |
| 6,058,102 A | 5/2000 | Drysdale et al. | |
| 6,058,262 A | 5/2000 | Kawas et al. | |
| 6,059,842 A | 5/2000 | Dumarot et al. | |
| 6,061,722 A | 5/2000 | Lipa et al. | |
| 6,075,541 A | 6/2000 | Maclinovsky | |
| 6,085,335 A | 7/2000 | Djoko et al. | |
| 6,088,522 A | 7/2000 | Lee et al. | |
| 6,104,699 A | 8/2000 | Holender et al. | |
| 6,108,309 A | 8/2000 | Cohoe et al. | |
| 6,111,857 A | 8/2000 | Soliman et al. | |
| 6,119,010 A * | 9/2000 | Labedz | 455/446 |
| 6,122,083 A | 9/2000 | Ohta et al. | |
| 6,148,010 A | 11/2000 | Sutton et al. | |
| 6,151,310 A * | 11/2000 | Dent | 370/330 |
| 6,199,032 B1 | 3/2001 | Anderson | |
| 6,204,813 B1 | 3/2001 | Wadell et al. | |
| 6,208,833 B1 | 3/2001 | Preschutti et al. | |
| 6,229,540 B1 | 5/2001 | Tonelli et al. | |
| 6,236,363 B1 | 5/2001 | Robbins et al. | |
| 6,243,772 B1 | 6/2001 | Ghori et al. | |
| 6,253,086 B1 | 6/2001 | Parantainen et al. | |
| 6,285,377 B1 | 9/2001 | Greenbaum et al. | |
| 6,289,203 B1 | 9/2001 | Smith et al. | |
| 6,308,072 B1 * | 10/2001 | Labedz et al. | 455/448 |
| 6,311,144 B1 | 10/2001 | Abu El Ata | |
| 6,317,599 B1 | 11/2001 | Rappaport et al. | |
| 6,326,987 B2 | 12/2001 | Alexander | |
| 6,330,005 B1 | 12/2001 | Tonelli et al. | |
| 6,337,688 B1 | 1/2002 | Berstis | |
| 6,338,031 B1 | 1/2002 | Lee et al. | |
| 6,356,758 B1 | 3/2002 | Almeida et al. | |
| 6,393,432 B1 | 5/2002 | Flansburg et al. | |
| 6,408,312 B1 | 6/2002 | Forthman et al. | |
| 6,442,507 B1 | 8/2002 | Skidmore et al. | |
| 6,470,195 B1 | 10/2002 | Meyer | |
| 6,487,417 B1 | 11/2002 | Rossoni et al. | |
| 6,493,679 B1 | 12/2002 | Rappaport et al. | |
| 6,496,290 B1 | 12/2002 | Lee | |
| 6,499,006 B1 * | 12/2002 | Rappaport et al. | 703/20 |
| 6,505,045 B1 | 1/2003 | Hills et al. | |

OTHER PUBLICATIONS

G. Durgin, T.S. Rappaport, H. Xu, Measurements and Models for Radio Path Loss and Penetration Loss in and Around Homes and Trees at 5.85 GHz, IEEE Transactions on Communications, vol. 46, No. 11, Nov. 1998.

C.M. Peter Ho et al., "Antenna Effects on Indoor Obstructed Wireless Channels and a Deterministic Image-Based Wide-Band Propagation Model for In-Building Personal Communications Systems," International Journal of Wireless Information Networks, vol. 1, No. 1, 1994.

S. Kim et al., "Radio Propagation Measurements and Predictions Using Three-dimensional Ray Tracing in Urban Environments at 908 MHZ and 1.9 GHz," IEEE Transactions on Vehicular Technology, vol. 48, No. 3, May 1999.

T.S., Rappaport et al., "Use of Topographic Maps with Building Information to Determine Antenna Placements and GPS Satellite Coverage for Radio Detection and Tracking in Urban Environments," MPRG Technical Report MPRG-TR-95-14, Virginia Tech, Sep. 1995.

R.K. Morrow, Jr. and T.S. Rappaport, "Getting In," Wireless Review Magazine, Mar. 2000.

Wireless Valley Communications, Inc., "SitePlanner 3.16 for Windows 95/98/NT User's Manual," Software User's Manual, pp. 5-148 to 5-156, 1999.

M. Panjwani et al., "Interactive Computation of Coverage Regions for Wireless Communications in Multifloored indoor Environments," IEEE Journal on Selected Areas in Communications, vol. 14, No. 3, Apr. 1996.

L. Piazzi and H.L. Bertoni, "Achievable Acurracy of Site-Specific Path-Loss Predictions in Residential Environments" IEEE Transactions on Vehicular Technology, vol. 48, No. 3, May 1999.

T.S. Rappaport et al., "Wireless Communications: Past Events and a Future Perspective", IEEE Communications Magazine, May 2002.

T.S. Rappaport et al., "Radio Propagation Prediction Techniques and Computer-Aided Channeling Modeling for Embedded Wireless Microsystems," ARPA Annual Report, MPRG Technical Report MPRG-TR-94-12, Virginia Tech, Jul. 1994.

T.S., Rappaport et al., "Use of Topographic Maps with Building Information to Determine Antenna Placements for Radio Detection and Tracking in Urban Environments," MPRG Technical Report MPRG-TR-95-14, Virginia Tech, Nov. 1995.

D. Ullmo et al., "Wireless Propagation in Buildings: A Statistical Scattering Approach," IEEE Transactions on Vehicular Technology, vol. 48, No. 3, May 1999.

T.S. Rappapoprt, "wireless Communications: Principles and Practice" Second Edition, Prentice Hall, 2002.

T.S.. Rappaport et al., "Use of Topographic Maps with Building Information to Determine AntennaPlacements and GPS Satellite Coverage for Radio Detection and Tracking in Urban Environments," MPRG Technical Report MPRG-TR-95-14, Virginia Tech, Sep. 1995.

T.S. Rappaport et al., "Indoor Path Loss Measurement for Homes and Apartments at 2.4 and 5.85 GHz," private report produced for Motorola, Dec. 16, 1997.

T.S. Rappaport, "Isolating Interference," Wireless Review Magazine, May 2000.

Slides from T.S. Rappaport and R. Skidmore, "Introduction to In-Building Wireless Systems," Infocast In-Building Wireless Solutions Conference and Exposition, Feb. 4, 2003.

S. Sandhu, M.P. Koushik, and T.S. Rappaport "Predicted Path Loss for Roslyn VA,First set of predictions for ORD Project on Site Specific Propagation Prediction," MPRG Technical Report MPRG-TR-94-20, Virginia Tech, Dec. 1994.

S. Sandhu, M.P. Koushik, and T.S. Rappaport "Predicted Path Loss for Roslyn VA,First set of predictions for ORD Project on Site Specific Propagation Prediction," MPRG Technical Report MPRG-TR-94-20, Virginia Tech, Mar. 1995.

S. Seidel et al., "Site-Specific Propagation for Wireless In-Building Personal Communications Design," IEEE Transactions on Vehicular Technology, vol. 43, No. 4, Nov. 1994.

S. Shakkottai and T.S. Rappaport, "Research Challenge in Wireless Networks: A Technical Overview," Proceeding of the Fifth International Symposium on Wireles Personal Multimedia Communications, Honolulu, HI, Oct. 2002.

H. Sherali et al., "On the Optimal Location of Transmitters for Micro-cellular Radio Communication System Design," IEEE Journal on Selected Areas in Communications, vol. vol. 14, No. 3, pp. 662-673, May 1996.

R. Skidmore et al., "A Comprehensive In-Building and Microcellular Wireless Communication System Design Tool" The Bradley Department of Electrical Engineering, MPRG-TR-97-13, Jun. 1997. Master's Thesis—unpublished by Virginia Tech for 2 years after submission.

R. Skidmore, et al., Russell Senate Office Building Propagation Study, Project Report for Joseph R. Loring & Associates; "Assessment and Study of the Proposed Enhancements of the Wireless Communications Environment of the Russell Senate Office Building (RSOB) and Associated Utility Tunnels," AoC Contract # Acbr96088, prepared for Office of the Architect of the Capitol, Feb. 20, 1997.

R. Torres et al., "CINDOOR: An Engineering Tool for Planning and Design of Wireless Systems in Enclosed Spaces," IEEE Antennas and Propagation Magazine, vol. 41, No. 4, Aug. 1999.

R. Skidmore et al., "Interactive Coverage Region and System Design Simulation for Wireless Communication Systems in Multi-Floored Indoor Environments: SMT Plus tm," IEEE ICUPC Proceedings, 1996.

T.S. Rappaport et al., "Radio Propagation Prediction Techniques and Computer-Aided Channel Modeling for Embedded Wireless Microsystems," MPRG Tech. Report MPRG-TR-95-08, Virginia Tech, Jul. 1995.

Software by Andrew titled "RF Planner" dated Jun. 17, 1997.

A user guide titled "Andrew Microwave System Planner" dated Jul. 1999.

A user guide titled "Andrew Antenna System Planner" dated Jun. 1999.

Bell Laboratories, "Wise—A Wireless System Engineering Tool," *pub. date unknown*, web pages from http://www.bell-labs.com.

Ullmo, D. & Baranger, H. U., "Wireless Propagation in Buildings: A Statistical Scattering Approach," *IEEE Transactions on Vehicular Technology*, vol. 48, No. 3, pp. 947-955, May 1999.

Seidel, S. Y. & Rappaport, T. S., "Site-Specific Propagation Prediction for Wireless In-Building Personal Communication System Design," *IEEE Transaction on Vehicular Technology*, vol. 43, No. 4, pp. 879-891, Nov. 1994.

Panjwani, M. A., Abbott, A. L. & Rappaport, T. S., "Interactive Computation of Coverage Regions for Wireless Communication in Multifloored Indoor Environments," *IEEE Journal on Selected Areas in Communications*, vol. 14, No. 3, pp. 420-430, Apr. 1996.

Ho, C. M. P., Rappaport, & Koushik, M. P., "Antenna Effects on Indoor Obstructed Wireless Channels and a Deterministic Image-Based Wide-Band Propagation Model for In-Building Personal Communication Systems," *International Journal of Wireless Information Networks*, vol. 1, No. 1, pp. 61-76, 1994.

Kim, S. C., Guarino, B. J., Willis, T. M., Erceg, V., Fortune, S. J., Valenzuela, R. A., Thomas, L. W., Ling, J. & Moore, J. D., "Radio Propagation Measurements and Prediction Using Three-Dimensional Ray Tracing in Urban Environments at 908 MHz and 1.9Ghz," *IEEE Transactions on Vehicular Technology*, vol. 48, No. 3, pp. 931-946, May 1999.

Piazzi, L. & Bertoni, H. L., "Achievable Accuracy of Site-Specific Path-Loss Predictions in Residential Environments," *IEEE Transaction on Vehicular Technology*, vol. 48, No. 3, pp. 922-955, May 1999.

Durgin, G., Rappaport, T. S. & Xu, H., "Measurements and Models for Radio Path Loss and Penetration Loss In and Around Homes and Trees at 5.85 Ghz," *IEEE Transactions on Communications*, vol. 46, No. 11, pp. 1484-1496, Nov. 1998.

Sandhu, S., Koushik, P. & Rappaport, T. S., "Predicted Path Loss for Rosslyn, Virginia: First Set of Predictions," Virginia Polytechnic Institute and State University, Dec. 9, 1994.

Sandhu, S., Koushik, P. & Rappaport, T. S., "Predicted Path Loss for Rosslyn, Virginia: Second Set of Predictions for ORD Project on Site Specific Propagation Prediction," Virginia Polytechnic Institute and State University, Mar. 5, 1995.

Skidmore, R. R & Rappaport, T. S., "A Comprehensive In-Building and Microcellular Wireless Communication System Design Tool," Virginia Polytechnic Institute and State University, Jun. 9, 1997.

Rappaport, T. S., Koushik, M. P., Liberti, J.S., Pendyala, C. & Subramanian, T. P., "Radio Propagation Techniques and Computer-Aided Channel Modeling for Embedded Wireless Microsystems," Virginia Polytechnic Institute and State University, Jul. 1994.

Rappaport, T. S., Koushik, M. P., Carter, C. & Ahmed, M., "Radio Propagation Prediction Techniques and Computer-Aided Channel Modeling for Embedded Wireless Microsystems," Virginia Polytechnic Institute and State University, Jul. 1995.

Rappaport, T., S., Koushik, M. P., Ahmed, M., Carter, C., Newhall, B. & Zhang, N., "Use of Topographic Maps with Building Information to Determine Antenna Placements and GPS Satellite Coverage for Radio Detection and Tracking in Urban Environments," Virginia Polytechnic Institute and State University, Sep. 1995.

Article "Building Database Manipulator" Copyright, Jan. 1998; MPRG and Virginia Tech.

PCS 97 Track 7; Engineering & Systems Management; T. Rappaport.

Propagator; vol. 8, No. 3; Fall 1997.

SMT Plus 1.0 User's Manual; R. Skidmore & T. Rappaport; Copyright, Aug. 1996; Virginia Tech.

* cited by examiner

SYSTEM FOR THE THREE-DIMENSIONAL DISPLAY OF WIRELESS COMMUNICATION SYSTEM PERFORMANCE

CROSS REFERENCE TO RELATED APPLICATIONS

This application is related to the applications having Ser. Nos. 09/221,985, filed Dec. 29, 1998 (now U.S. Pat. No. 6,442,507), 09/318,840, filed May 26, 1999 (now U.S. Pat. No. 6,317,599), 09/318,841, filed May 26, 1999, 09/352,678, filed Jul. 14, 1999, (now U.S. Pat. No. 6,499,006), and 09/318,842, filed May 26, 1999, (now U.S. Pat. No. 6,493,679) all herein incorporated by reference.

BACKGROUND OF THE INVENTION

1. Field of the Invention

The present invention generally relates to engineering and management systems for the design of wireless systems and, more particularly, to a method for displaying the performance of wireless systems in any environment (e.g., buildings, floors within a building, campuses, within cities, an outdoor setting, etc.) using a three-dimensional (3-D) visualization method.

2. Description of the Prior Art

As wireless communication systems proliferate, radio frequency (RF) coverage within and around buildings, and radio signal penetration into and out of buildings, has become a critical design issue for wireless engineers who must design and deploy cellular telephone systems, paging systems, or new wireless technologies such as personal communication systems (PCS), wireless local area networks (WLAN), and local multi-point distribution systems (LMDS). In addition, RF networks involving micromachinery, RF identification tags, and optical communication links are of increasing interest. Designers are frequently requested to determine if a radio transceiver location or base station cell site can provide adequate, reliable service throughout a room, a building, an entire city, a campus, a shopping mall, or any other environment. The costs of in-building and microcellular wireless communication devices are diminishing while the workload for wireless system design engineers and technicians to deploy such systems is increasing sharply. Given these factors, rapid engineering design and deployment methods accompanied by comprehensive system performance visualization and analysis methods are vital to wireless communication system designers.

Common to all wireless communication system designs is the desire to maximize the performance and reliability of the system while minimizing the deployment costs. Analyzing radio signal coverage and interference is of critical importance for a number of reasons. A design engineer must determine if an existing wireless system will provide sufficient signal power throughout the desired service area. Alternatively, wireless engineers must determine whether local area coverage will be adequately supplemented by existing large scale outdoor wireless systems, or macrocells, or whether indoor wireless transceivers, or picocells, must be added. The placement of these cells is critical from both a cost and performance standpoint. The design engineer must predict how much interference can be expected from other wireless systems and where it will manifest itself within the environment.

Depending upon the design goals, the performance of a wireless communication system may involve a combination of one or more factors. For example, the total area covered in adequate received signal strength (RSSI), the area covered in adequate data throughput levels, and the number of customers that can be serviced by the system are among the deciding factors used by design engineers in planning the placement of communication equipment comprising the wireless system. Thus, maximizing the performance of a wireless system may involve the complex analysis of multiple, potentially unrelated factors. The ability to display the results of such analysis in a manner easily interpretable by design engineers is invaluable in wireless system deployment. Three dimensional (3-D) visualization of wireless system operating parameters provides the user with rapid assimilation of large data sets and their relation to the physical environment. As wireless systems proliferate, these issues must be resolved quickly, easily, and inexpensively, in a systematic and repeatable manner.

There are many computer aided design (CAD) products on the market that can be used to design a computerized model of an environment. WiSE™ from Lucent Technology, Inc., SignalPro™ from EDX, PLAnet™ by Mobile Systems International, Inc., and TEMS from Ericsson are examples of CAD products developed to aid in the design of wireless communication systems.

Lucent Technology, Inc., offers WiSE™ as a design tool for wireless communication systems. The WiSE system predicts the performance of wireless communication systems based on a computer model of a given environment using a deterministic radio coverage predictive technique known as ray tracing.

EDX offers SignalPro™ as a design tool for wireless communication systems. The SignalPro system predicts the performance of wireless communication systems based on a computer model of a given environment using a deterministic RF power predictive technique known as ray tracing.

Mobile Systems International, Inc., offers PLAnet™ as a design tool for wireless communication systems. The PLAnet system predicts the performance of macrocellular wireless communication systems based upon a computer model of a given environment using statistical and empirical predictive techniques.

Ericsson Radio Quality Information Systems offers TEMS™ as a design and verification tool for wireless communication indoor coverage. The TEMS system predicts the performance of indoor wireless communication systems based on a building map with input base transceiver locations and using empirical radio coverage models.

The above-mentioned design tools have aided wireless system designers by providing facilities for predicting the performance of wireless communication systems and displaying the results in the form of flat, two-dimensional grids of color or flat, two-dimensional contour regions. Such displays, although useful, are limited by their two-dimensional nature in conveying all nuances of the wireless system performance. For example, slight variations in color present in a two-dimensional grid of color, which may represent changes in wireless system performance that need to be accounted for, may be easily overlooked. Furthermore, as wireless systems proliferate, the ability to visually predict and design for coverage and interference is of increasing value.

In addition, recent research efforts by AT&T Laboratories, Brooklyn Polytechnic, and Virginia Tech are described in papers and technical reports entitled:

S. Kim, B. J. Guarino, Jr., T. M. Willis III, V. Erceg, S. J. Fortune, R. A. Valenzuela, L. W. Thomas, J. Ling, and J. D. Moore, "Radio Propagation Measurements and Predictions Using Three-dimensional Ray Tracing in Urban Environments at 908 MHZ and 1.9 GHz," *IEEE Transactions on Vehicular Technology*, vol. 48, no. 3, May 1999 (hereinafter "Radio Propagation");

L. Piazzi, H. L. Bertoni, "Achievable Accuracy of Site-Specific Path-Loss Predictions in Residential Environments," *IEEE Transactions on Vehicular Technology*, vol. 48, no. 3, May 1999 (hereinafter "Site-Specific");

G. Durgin, T. S. Rappaport, H. Xu, "Measurements and Models for Radio Path Loss and Penetration Loss In and Around Homes and Trees at 5.85 GHz," *IEEE Transactions on Communications*, vol. 46, no. 11, Nov. 1998;

T. S. Rappaport, M. P. Koushik, J. C. Liberti, C. Pendyala, and T. P. Subramanian, "Radio Propagation Prediction Techniques and Computer-Aided Channel Modeling for Embedded Wireless Microsystems," ARPA Annual Report, MPRG Technical Report MPRG-TR-94-12, Virginia Tech, Jul. 1994;

T. S. Rappaport, M. P. Koushik, C. Carter, and M. Ahmed, "Radio Propagation Prediction Techniques and Computer-Aided Channel Modeling for Embedded Wireless Microsystems," MPRG Technical Report MPRG-TR-95-08, Virginia Tech, Jul. 1994;

T. S. Rappaport, M. P. Koushik, M. Ahmed, C. Carter, B. Newhall, and N. Zhang, "Use of Topographic Maps with Building Information to Determine Antenna Placements and GPS Satellite Coverage for Radio Detection and Tracking in Urban Environments," MPRG Technical Report MPRG-TR-95-14, Virginia Tech, Sep. 1995;

T. S. Rappaport, M. P. Koushik, M. Ahmed, C. Carter, B. Newhall, R. Skidmore, and N. Zhang, "Use of Topographic Maps with Building Information to Determine Antenna Placement for Radio Detection and Tracking in Urban Environments," MPRG Technical Report MPRG-TR-95-19, Virginia Tech, Nov. 1995; and S. Sandhu, M. P. Koushik, and T. S. Rappaport, "Predicted Path Loss for Rosslyn, VA, Second set of predictions for ORD Project on Site Specific Propagation Prediction," MPRG Technical Report MPRG-TR-95-03, Virginia Tech, Mar. 1995.

The papers and technical reports are illustrative of the state-of-the-art in site-specific radio wave propagation modeling. While most of the above papers describe a comparison of measured versus predicted RF signal coverage and present tabular or two dimensional (2-D) methods for representing and displaying predicted data, they do not report a comprehensive method for visualizing and analyzing wireless system performance. The "Radio Propagation" and "Site-Specific" papers make reference to 3-D modeling, but do not offer display methods or graphical techniques to enable a user to visualize signal coverage or interference in 3-D.

SUMMARY OF THE INVENTION

It is therefore an object of the present invention to facilitate the three-dimensional, multi-colored display of predicted performance results for any type of wireless communication system.

It is another object of the present invention to provide a mechanism for viewing a three-dimensional display of predicted performance results from any angle, orientation, distance, or perspective.

It is another object of the present invention to provide a mechanism for viewing a three-dimensional display of predicted performance results and interacting with the display in real-time to alter the current viewpoint and perspective.

It is another object of the present invention to provide said display of predicted performance results overlaid on a three-dimensional database that may involve a plurality of building structures and the surrounding terrain, flora, climatic conditions, and additional static and dynamic obstacles (e.g., automobiles, people, filing cabinets, etc.).

It is another object of the present invention to provide a mechanism for coloring, shading, and otherwise rendering a solid representation of said three-dimensional display utilizing multiple colors and transparency effects.

According to the present invention, a system is provided for allowing a RF system designer to dynamically model a wireless system electronically in any environment. The method includes the selection and placement of models of various wireless system hardware components, such as antennas (point, omnidirectional, directional, leaky feeder, etc.), transceivers, amplifiers, cables, splitters, and the like, and allows the user to visualize, in three-dimensions, the effects of their placement and movement on overall system performance throughout the modeled environment. Thus, the placement of components can be refined and fine-tuned prior to actual implementation of a system to ensure that all required regions of the desired service area are blanketed with adequate RF coverage, data throughput, or system performance. The three-dimensional visualization of system performance provides RF system designers with tremendous insight into the functioning of the modeled wireless communication system, and represents a marked improvement over previous visualization techniques.

To accomplish the above, a 3-D model of the physical environment is stored as a CAD model in an electronic database. The physical, electrical, and aesthetic parameters attributed to the various parts of the environment such as walls, floors, foliage, buildings, hills, and other obstacles that affect radio waves are also stored in the database. A representation of the 3-D environment is displayed on a computer screen for the designer to view. The designer may view the entire environment in simulated 3-D, zoom in on a particular area of interest, or dynamically alter the viewing location and perspective to create a "fly-through" effect. Using a mouse or other input positioning device the designer may select and view various communication hardware device models from a series of pull-down menus. A variety of amplifiers, cables, connectors, and other hardware devices may be selected, positioned, and interconnected in a similar fashion by the designer to form representations of complete wireless communication systems.

A region of any shape or size may be selected anywhere within the displayed environment, or automatically selected based upon certain criteria (e.g., selecting an entire building). The selected region is overlaid with a grid containing vertices of selectable size, shape, and spacing to form a mesh or blanket. Each vertex corresponds to a single point within the 3-D environment. Thereafter, a wireless system performance prediction model is run whereby the computer displays on the screen at each vertex of the mesh the predicted RF values, for instance, received signal strength intensity (RSSI), network throughput, bit error rate, frame error rate, signal-to-interference ratio (SIR), and signal-to-noise ratio (SNR), provided by the communication system just designed. The display is such that the computer adjusts the elevation and/or coloring including characteristics such as saturation, hue, brightness, line type and width, transparency, surface texture, etc., of each vertex relative to the surrounding vertices to correspond to the calculated RF values. The coloring and elevation may correspond to the same calculated RF value or to different calculated RF values. For example, elevation may correspond to received signal strength intensity (RSSI), and color may correspond to signal-to-noise ratio (SNR), or any other of a variety of calculated RF parameters. The user is able to specify boundaries for this display in terms of selecting the range of elevations, colors, or other aesthetic characteristics from which the vertices of the mesh are assigned. Alternatively, the system can automatically select limits and ranges for the heights, colors, and other aesthetic characteristics. The result is a region of fluctuating color and elevation representing the changing wireless system performance throughout different portions of the modeled 3-D environment. The region may be viewed overlaid with the 3-D environment.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Using the present method, it is now possible to assess the performance of a wireless communication system to a much higher level of precision than previously possible. The present method is a significant advance over the prior art in the display of predicted performance of wireless communication systems. The design of wireless communication systems is often a very complex and arduous task, with a considerable amount of effort required to simply analyze the results of predicted performance. In the prior art, the only options available for displaying predicted coverage areas involve the two-dimensional display of boundary contours or colored grids overlaid with a two-dimensional representation of the environment. This is prohibitive to a design engineer in terms of the amount of information conveyed.

Figure 1:
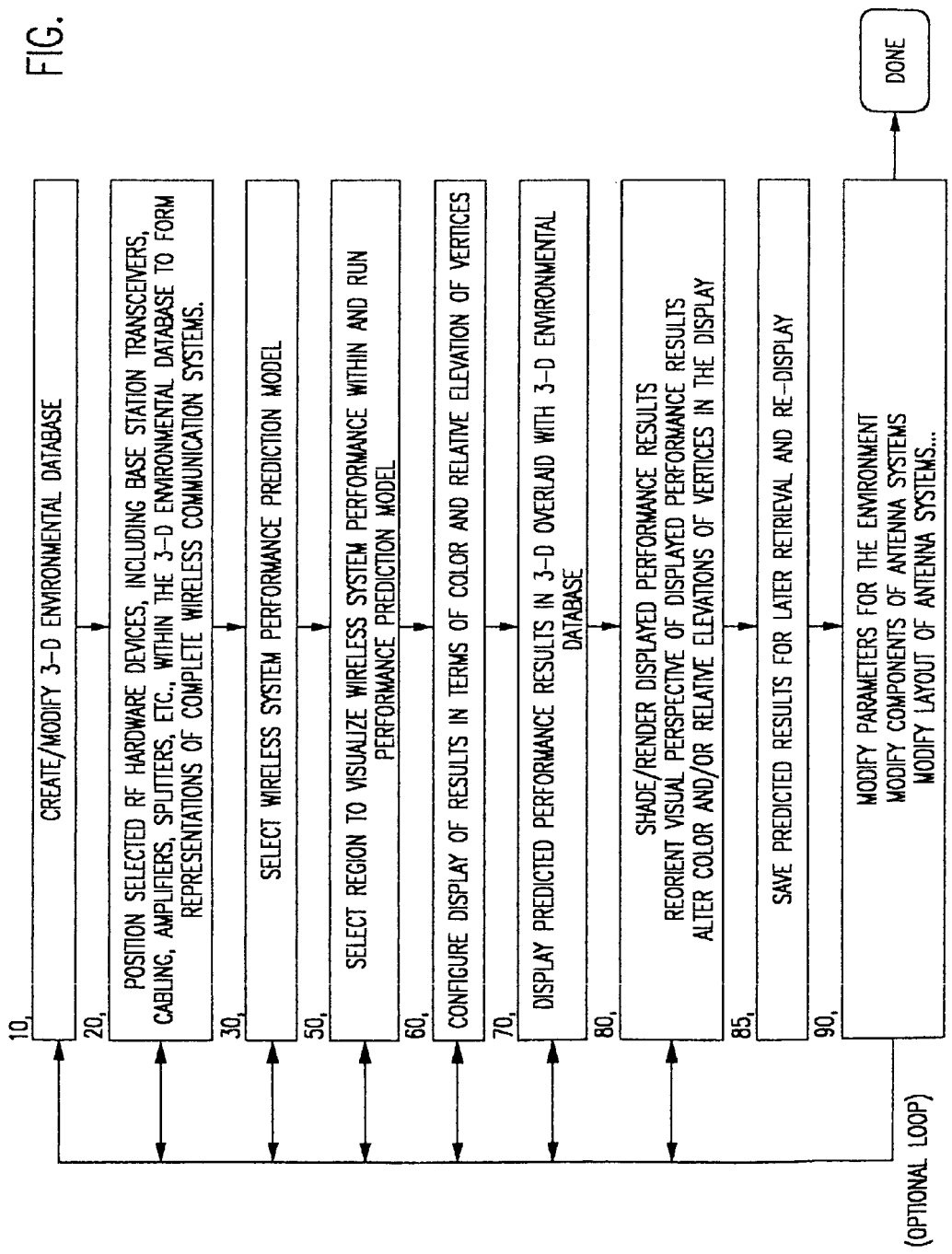
FIG. 1 is a flow diagram of the general method of the present invention.

Referring to FIG. 1, there is shown a flow diagram according to the present invention. Before one can run an automated performance predictive model on a desired environment, a 3-D electronic representation of that environment must be created in function block 10. The preferred method for generating a 3-D environmental database is disclosed in the co-pending application Ser. No. 09/318,841, filed on May 26, 1999. The resulting definition utilizes a specially formatted vector database comprising lines and polygons that represent physical objects within the environment. The arrangement of lines and polygons in the database corresponds to physical objects in the environment. For example, a line or other shape in the database could represent a wall, a door, a tree, a building wall, or some other physical object in the modeled environment.

From the standpoint of radio wave propagation, each obstruction/partition in an environment (i.e., each line or polygon in the drawing) has electromagnetic properties that affect a radio wave. When a radio wave signal intersects a physical surface, it interacts with the electromagnetic properties of the surface. A certain percentage of the radio wave reflects off of the surface and continues along an altered trajectory; a certain percentage of the radio wave penetrates through the surface and continues along its course; a certain percentage of the radio wave is scattered once it strikes the surface, etc. The electromagnetic properties given to the obstruction/partition defines this interaction, and thus defines the break down in percentages of the radio wave reacting in a given manner upon intersection. In terms of the environmental database, each obstruction/partition has several parameters used to define its electromagnetic properties. For example, the attenuation factor of a partition determines the amount of power lost by a radio signal that penetrates through it; the reflectivity of a partition determines the portion of the radio signal reflected from it; and the surface roughness of a partition determines the portion of the radio signal that is scattered upon intersection.

Once the 3-D environmental database has been constructed, the designer identifies and specifies the location and type of all wireless communication system equipment within the 3-D environmental database in function block 20. This point-and-click process involves the user selecting the desired hardware component from a computer parts database and then visually positioning, orienting, and interconnecting various hardware components within the 3-D environmental database to form complete wireless communication systems. The preferred embodiment of the computer parts database, referred to hereinafter as a parts list library, is more fully described in co-pending application Ser. No. 09/318,842, filed on May 26, 1999. The resulting interconnected network of base station transceivers, cabling, connectors/splitters, amplifiers, antennas, and other RF hardware components (commonly known as a wireless distribution or antenna system) is preferably assembled using either a drag-and-drop or a pick-and-place technique and is graphically displayed overlaid with the 3-D environmental database. Each component utilizes electromechanical information available from the parts list library that fully describes the component in terms of its physical operating characteristics (e.g., the noise figure, frequency, radiation characteristics, etc.). This information is directly utilized during the prediction of wireless system performance metrics.

In function block 30, the designer selects the wireless communication system performance predictive model to utilize. The preferred embodiment uses a number of methods to predict and optimize performance in a wireless communication network. These include methods to incorporate and build upon performance prediction techniques such as those described in the previously cited and following technical reports and papers: "Interactive Coverage Region and System Design Simulation for Wireless Communication Systems in Multi-floored Indoor Environments: SMT Plus," IEEE ICUPC '96 Proceedings, by R. Skidmore, T. Rappaport, and A. L. Abbott, and "SitePlanner 3.16 for Windows 95/98/NT User's Manual", Wireless Valley Communications, Inc. 1999, all of which are hereby incorporated by reference. It would be apparent to one skilled in the art how to apply other wireless communication system performance models to this method.

Next, the designer selects the area within the 3-D environmental database in which to predict how the currently modeled wireless communication systems will perform in function block 50. This is a point-and-click process in which the designer uses the mouse or other pointing device to designate the boundary of a region that encapsulates the area of interest within the 3-D environmental database. The region identified by the user represents a two-dimensional (2-D) plane within the 3-D environmental database. Once the region has been identified, the computer automatically segments the region into a grid of vertices ("mesh"). The designer is free to specify the size of each vertex and spacing between vertices of the mesh. Although the designated region is rectangular in the preferred embodiment of the invention, one skilled in the art could see that the designated region could be of any shape. The computer then calculates the selected wireless system performance predictive model on the region.

Once the performance prediction is complete, the designer is free to configure the display of the results in function block 50. The displayed results may be presented on a display screen, printed or otherwise 3-D rendered. The range of values to display and the color and other aesthetic characteristics such as saturation, hue, brightness, line type and width, transparency, surface texture, etc., to associate with each value are selectable, or may be automatically adjusted by the system. For example, if displaying received signal strength intensity (RSSI), the user may select to only display those portions of the region having a predicted RSSI within the range −50 dBm to −75 dBm, and may assign specific colors to correspond to RSSI values within that range. For example, the user may assign the color red to represent a predicted RSSI value between −50 dBm and −55 dBm, green to represent a predicted RSSI value between −56 dBm and −60 dBm, etc. Thus, the region is displayed as a pattern of fluctuating colors where the color assigned to each vertex within the grid corresponds to a certain value for the predicted performance metric.

In similar fashion, each vertex of the grid repositioned vertically in 3-D space. The elevation of each vertex directly corresponds to a certain value of predicted performance. In the preferred embodiment of the invention, the user specifies the maximum and minimum elevation to assign to vertices, and the computer automatically scales the elevation of each vertex according to its predicted performance value. For example, if the user selects a minimum height of 0.0 meters and a maximum height of 20.0 meters, and the predicted performance values for the entire grid range from −50 dBm to −70 dBm for an RSSI prediction, if a given vertex has a value of −60 dBm it will be assigned an elevation of 10.0 meters. All elevations are specified relative to the 3-D environmental database.

Any combination of elevation, color, and other aesthetic characteristics may be used to customize the display of predicted performance results. For example, signal-to-interference ratio (SIR) may be displayed as fluctuating elevation within the region while received signal strength (RSSI) is displayed by fluctuating colors. Data throughput may be displayed as varying colors while bit error rate (BER) is displayed using differing line types. Any combination of elevation, color, and aesthetic characteristics may be associated with any combination of predicted performance result metric to produce the 3-D display.

The results of the performance prediction are displayed in function block 70 overlaid with or superimposed on the 3-D environmental database, allowing the user to analyze the performance of the current wireless communication system design. The display can be further customized in function block 80. The designer may reorient the viewing direction and zoom factor of the display to achieve varying perspectives of the predicted results. The results may be redisplayed in a variety of forms, including 3-D wireframe with hidden lines removed, 3-D semi-transparent, 3-D shaded or patterned, 3-D rendered, or 3-D photo-realistically rendered. The designer is free to interact with the displayed results in a variety of ways, including real-time panning and zooming to create a "fly-through" effect. The predicted performance results may be saved for later recovery and redisplay in function block 85.

The designer may then decide to modify the electromechanical properties assigned to objects within the 3-D environmental database, modify the type, orientation, or placement of components within the antenna systems, and/or add or remove wireless system hardware components in function block 90. Performance predictions can then be repeated and the results displayed as described above. Once the design is as desired, then the 3-D database contains all of the information necessary to procure the necessary components for installing the wireless system. The locations of each component are clearly displayed, and a visual 3-D representation can be viewed as a guide.

In addition, in function block 90, the various components of the communication system (i.e., transmitters, receivers, transceivers, antennas, cables, etc.) can be moved within the environment as well as components of the environment itself in real time. In this manner, the displayed results superimposed on the displayed 3-D environment are also updated in real time allowing the designer to immediately ascertain the effect of the repositioning.

The preferred embodiment of the invention utilizes a 3-D environmental database containing information relevant to the prediction of wireless system performance. This information includes but is not limited to the location, physical, electrical, and aesthetic properties of objects within the 3-D environment, where an object is any physical entity or landscape feature, such as a tree, wall, door, person, climatic condition, hill, etc.

Figure 2:
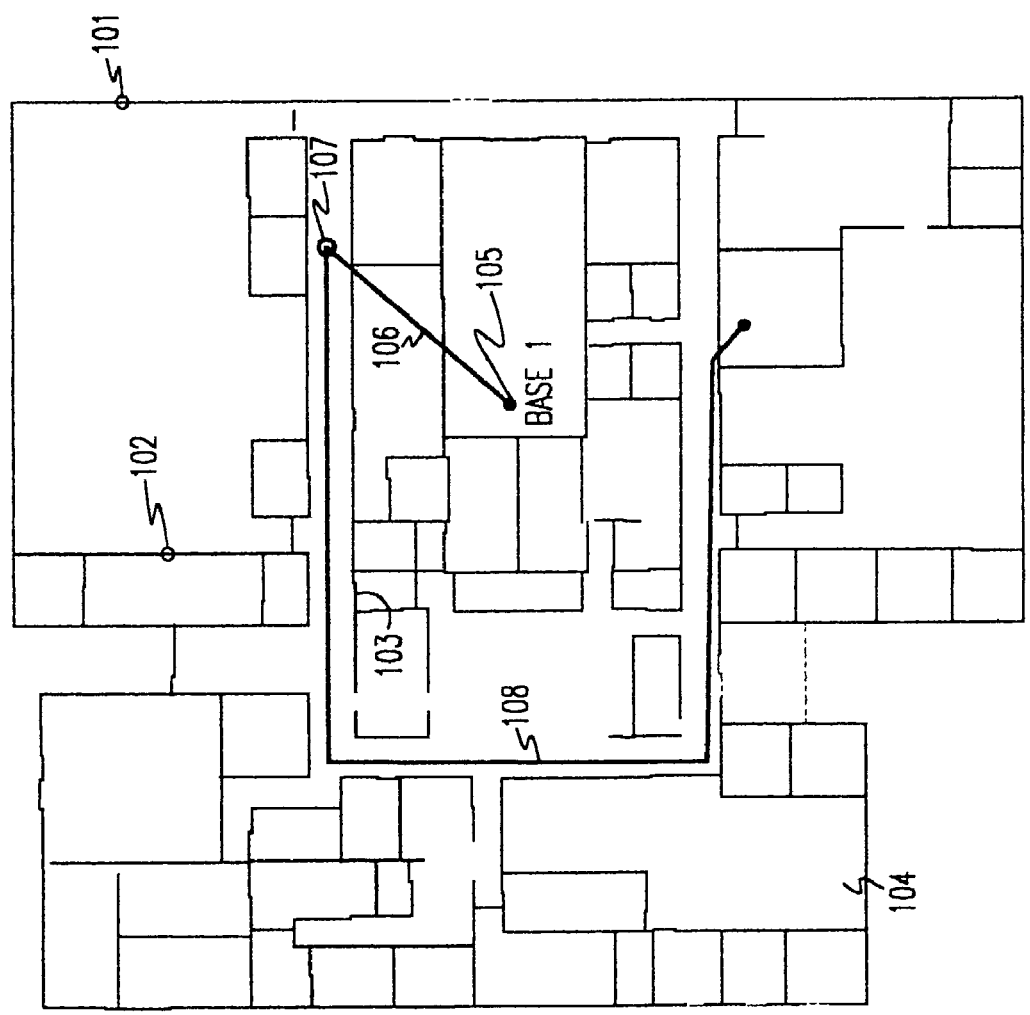
FIG. 2 shows an example of a simplified layout of a floor plan of a building.

Referring now to FIG. 2, there is shown a two-dimensional (2-D) simplified layout of a building floor plan. The method uses a three-dimensional (3-D) computer aided design (CAD) representation of a building, a collection of buildings, and/or the surrounding terrain and foliage. However, for simplicity of illustration, a 2-D figure is used. The various physical objects within the environment such as external walls 101, internal walls 102, doors 103, and floors 104 are assigned appropriate physical, electrical, and aesthetic values such as height, attenuation or RF penetration loss, surface roughness, reflectivity, color, etc. The attenuation factor describes the amount of power a radio signal loses upon striking a given object. The surface roughness provides information used to determine the portion of a radio signal that is scattered and/or dissipated upon striking a given object. The reflectivity provides information used to determine the portion of a radio signal that is reflected upon striking a given object. The values for these and other parameters assigned to objects within the 3-D environmental database vary depending upon the type of object being represented. For example, external walls 101 may be given a 15 dB attenuation value and have a very rough surface, whereas the interior walls 102 may only have a 3.2 dB attenuation loss.

Figure 3:
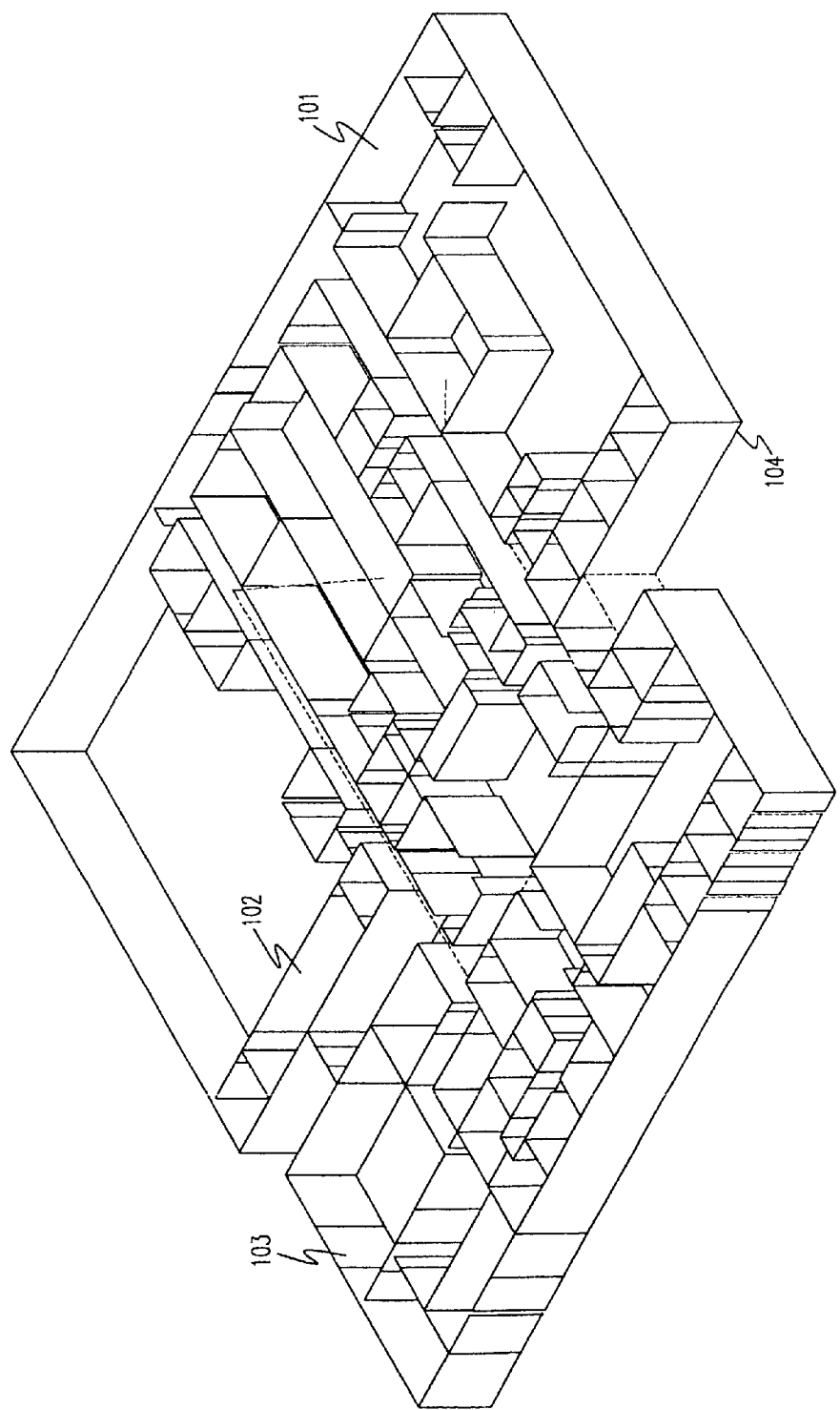
FIG. 3 shows a three-dimensional perspective of a building floor plan.

The three-dimensional nature of the environmental database is shown in FIG. 3, which displays the same building layout as in FIG. 2 from a different orientation. Again, the physical objects within the environment such as external walls 101, internal walls 102, doors 103, and floors 104 are easily identifiable.

Estimated partition electrical properties may be extracted from extensive propagation measurements already published, or the partition parameters can be measured directly and optimized instantly using the present invention combined with those methods described in the co-pending application Ser. No. 09/221,985 filed on Dec. 29, 1998, entitled "System for Creating a Computer Model and Measurement Database of a Wireless Communication Network" filed by T. S. Rappaport and R. R. Skidmore Once the desired physical and electrical properties are specified for the objects in the environment, any desired number of wireless system devices can be placed at any location in the 3-D environmental database, and performance predictions can be plotted directly onto the CAD drawing. The 3-D environmental database could be built through any number of methods, the preferred being disclosed in the concurrently filed co-pending application Ser. No. 09/318,841.

A base station transceiver 105 has been positioned and modeled within the 3-D environmental database. A length of cable 106 has been connected to the base station transceiver and extended throughout a portion of the database. A connector 107 has been attached to the end of the cable 108, and a length of radiating cable or leaky feeder 108 has been run throughout the database. Because the method allows any type of wireless system to be modeled, while analyzing the component and installation costs as disclosed in the concurrently filed, co-pending application Ser. No. 09/318,842, "what-if" designs and scenarios can be carried out with minimum guess work and wasted time.

FIG. 3 depicts the three-dimensional perspective of a building floor plan. Referring to FIG. 3, there are several partitions within the building structure, including exterior concrete walls 101 and interior sheetrock walls 102.

Figure 4:
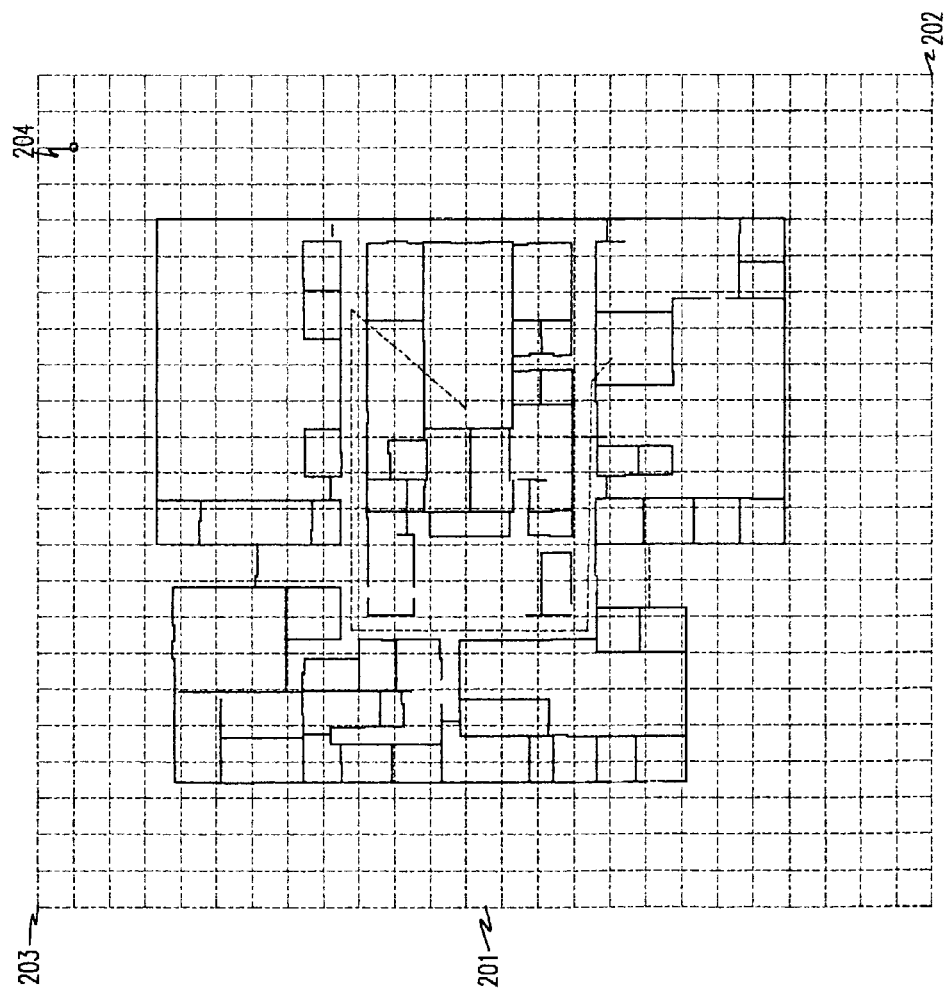
FIG. 4 shows an example region segmented into a grid that has been selected by a RF designer for displaying wireless system performance.

FIG. 4 depicts the same environmental database as shown in FIG. 3. The designer has specified the region within which the computer is to predict and display the performance of the modeled wireless communication systems. The region 201, is identified with a mouse or other input device by pointing and clicking on locations 202 and 203 within the 3-D environmental database. This identifies the opposite diagonals of a region within the database. Alternatively, the entire modeled environment can be automatically selected and bounded to form the region. The region is then segmented into a grid of vertices, known as a mesh. The user may specify the spacing between each vertex 204 of the mesh. If the spacing is reduced, the number of vertices is automatically adjusted to cover the region identified by the user. Thus, by reducing the spacing between the vertices, the user may control the number of vertices that form the mesh. Each vertex corresponds to a location within the 3-D environmental database at which a performance prediction will be carried out and displayed.

Figure 5:
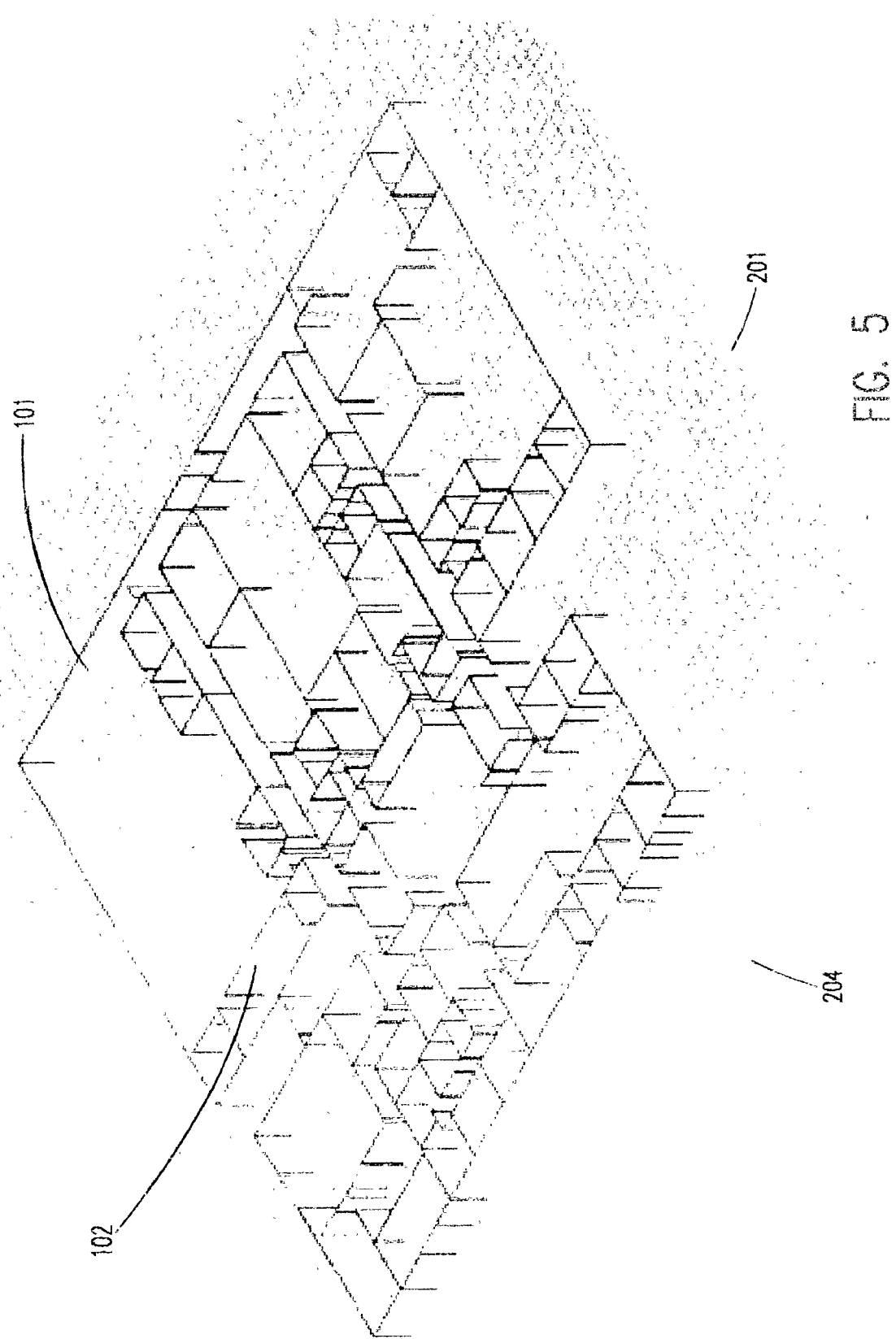
FIG. 5 shows a region similar to that shown in FIG. 3 prior to the calculation of wireless system performance and from a three-dimensional perspective.

FIG. 5 depicts the identical environmental database as shown in FIG. 4 from a three-dimensional perspective.

Figure 6:
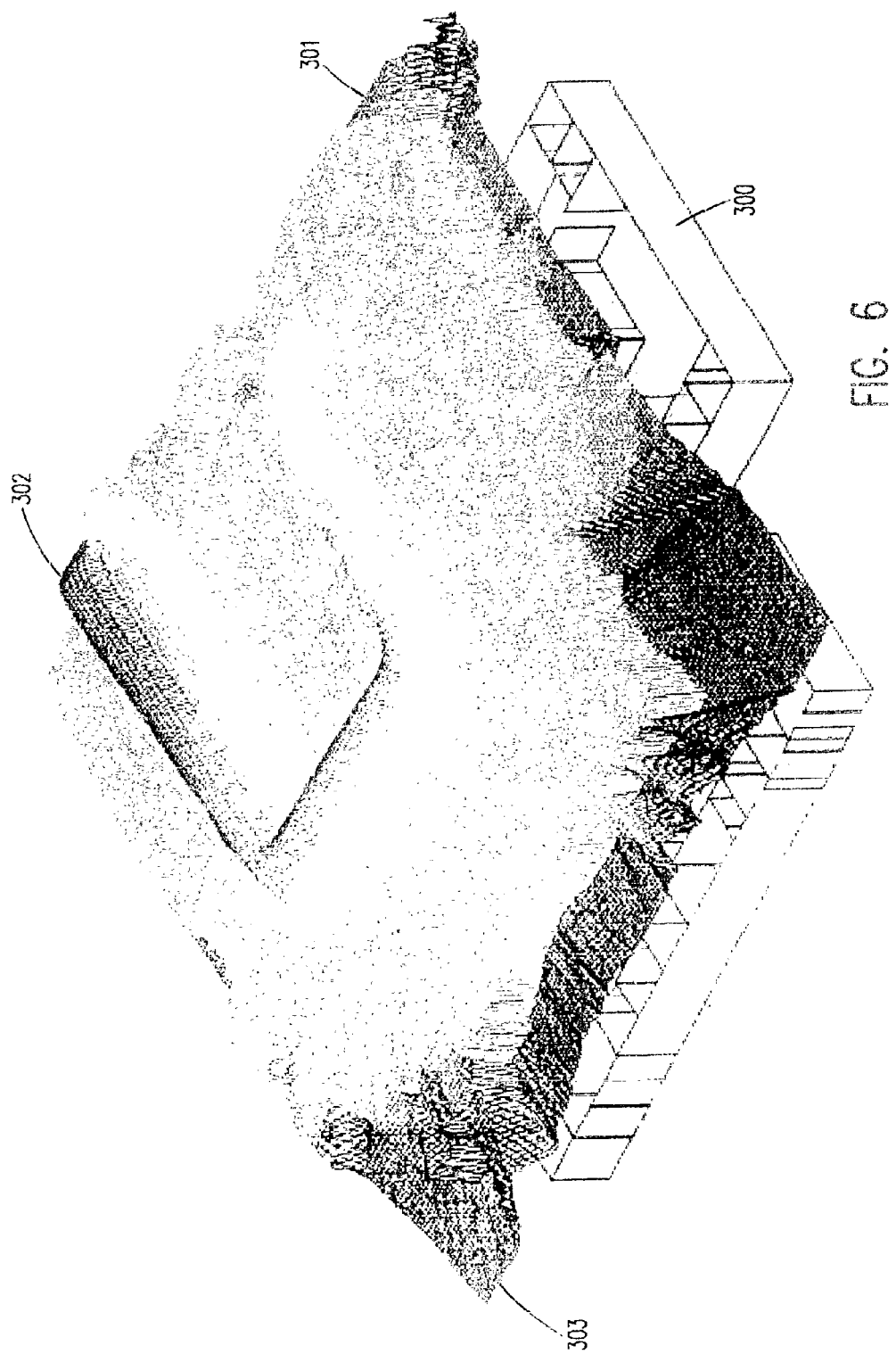
FIG. 6 shows the same region as in FIG. 3 following the calculation of wireless system performance and is exemplary of the three-dimensional display of system performance from the present invention.

FIG. 6 depicts the identical environmental database as shown in FIG. 5 following the prediction of performance for the wireless communication system modeled in FIG. 2. FIG. 6 shows received signal strength intensity (RSSI) as predicted within the modeled building environment for the base station transceiver 105 and the leaky feeder antenna 108 of FIG. 2. In FIG. 6, the building environment 300 is displayed underneath the predicted RSSI values. These values are calculated, for example using models as described in co-pending application Ser. No. 09/318,840. The grid 301 has assumed the form of a multi-colored region of fluctuating heights. Each vertex 204 within the grid from FIG. 3 has had both its color and elevation altered to represent the value of RSSI predicted for the point in 3-D space within the environmental database corresponding to the initial position of the vertex in FIG. 3. For example, in FIG. 6, vertices 302 with a relatively high elevation may be shown in red correspond to a higher level of predicted RSSI, while vertices 301 and 303 with a relatively lower elevation corresponding to a lower level of predicted RSSI may be shown in blue, with intermediate heights shown in progressive shades of red to blue or purples. The relative color, elevation, and other aesthetic characteristics of each vertex corresponds to the RSSI value predicted to occur. Although, the displayed results are shown strictly in terms of RSSI, one skilled in the art could see how this applies regardless of the performance metric selected. For example, in the present embodiment of the invention, similar displays could be generated for signal-to-interference ratios (SIR), signal-to-noise ratios (SNR), bit error rate (BER), frame error rate (FER), frame resolution per second, traffic, capacity, and data throughput.

Figure 7:
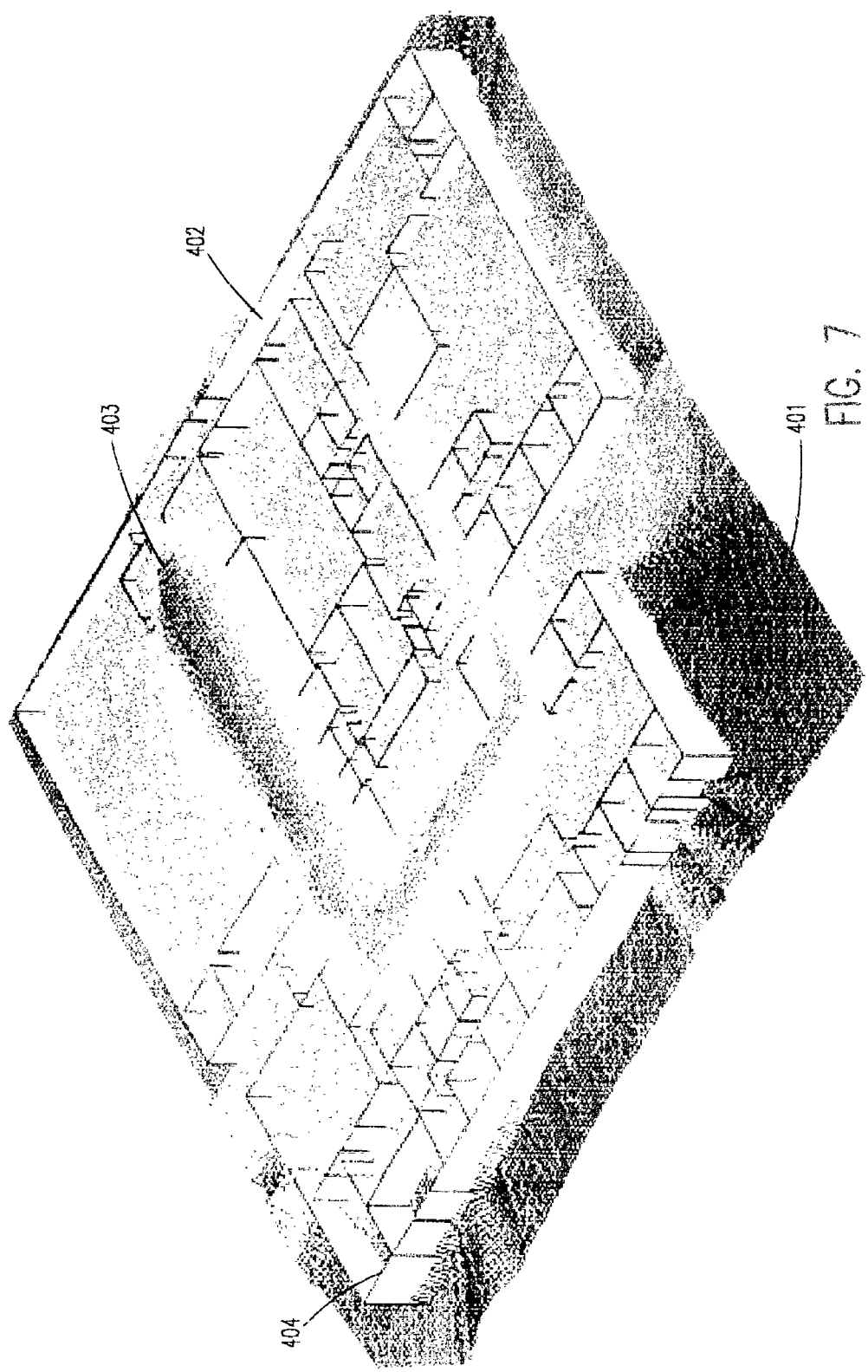
FIG. 7 shows the same region as in FIG. 6 following the user reducing relative elevations of the vertices and thus altering the display.

FIG. 7 depicts the identical results as shown in FIG. 6 with the exception that the user has altered the relative heights assigned to the vertices. The visual effect is to overlap the predicted performance results 401 with the 3-D environmental database 402. Such a perspective enables the designer to instantly recognize areas within the environment where there is sufficient system performance 403 and areas where there is inadequate system performance 404 simply by noting the color and/or relative height of the predicted results.

Figure 8:
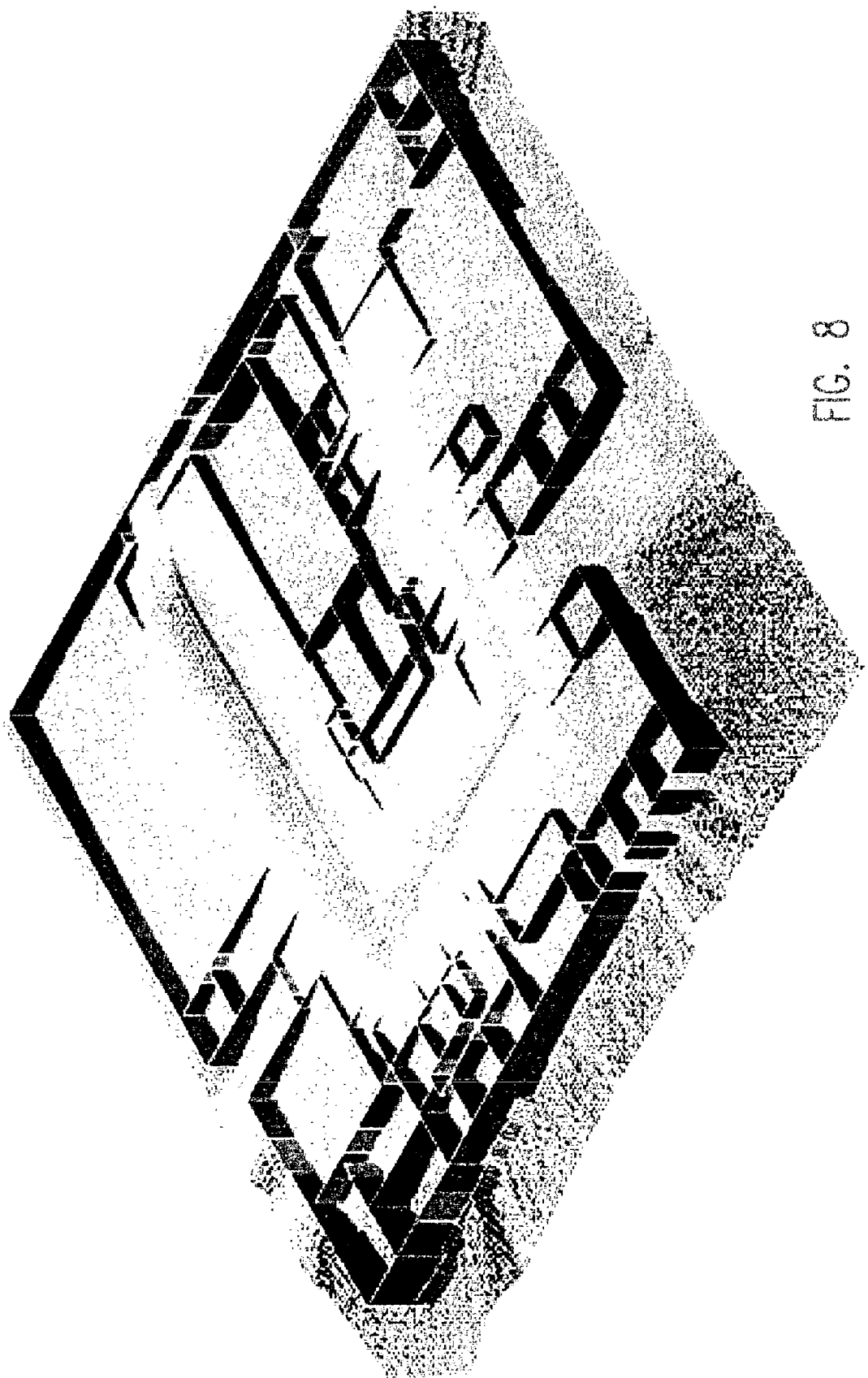
FIG. 8 shows the same region as in FIG. 7 following the user shading the display to produce an altered perspective of the performance results.

FIG. 8 depicts the identical results as shown in FIG. 7 with the exception that the user has shaded the environment produce a more realistic visual representation.

Figure 9:
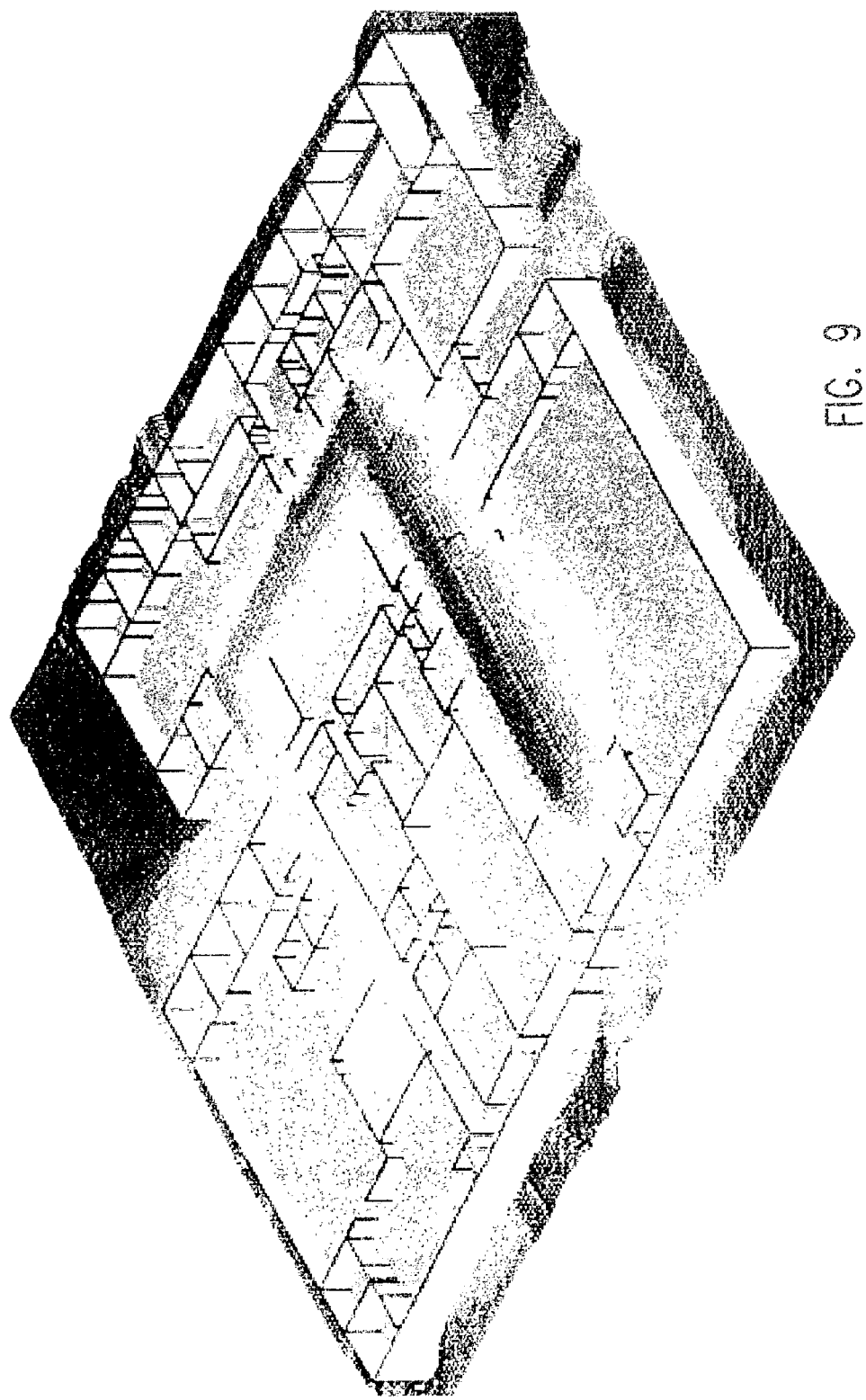
FIG. 9 shows the same region as in FIG. 6 following the user changing the view orientation to provide a different perspective of the performance results.

FIG. 9 depicts the identical results as shown in FIG. 7 with the exception that the user has altered the viewing orientation to achieve a different perspective of the predicted performance results.

While the invention has been described in terms of a single preferred embodiment, those skilled in the art will recognize that the invention can be practiced with modification within the spirit and scope of the appended claims. For example, this invention may not be limited just to wireless communication systems, but may be used to present any type of electromagnetic characteristics superimposed on any simulated three-dimensional environment. For example, the invention would find application in the next generation field of micromachines and nanomachines or micro-electrical-mechanical machines (MEMS). These machines are extremely small yet highly sophisticated functional elements that allow them to perform complicated tasks in hard-to-access locations, such as inside the human body, in plumbing, in jet engines, etc. It will be necessary to both wirelessly communicate with these machines as well as wirelessly provide power for these machines, such as in the form of RF pulses, infrared (IR) light or any other form of electromagnetic medium. The present invention would therefore facilitate the modeling and presentation of this or any other wireless electromagnetic system.

We claim:

1. A system for modeling a communications network, comprising:
   a three dimensional environmental computer database model of a site where a communications network may be deployed;
   a display for displaying a three-dimensional site map of said site, the three-dimensional site map including non-network elements;
   means for selecting computer representations of one or more components which may be used in said communications network from amongst a database of computer representations of components, said computer representations of each of said one or more components comprising performance data;
   means for positioning said one or more components on said three-dimensional site map of said site;
   means for calculating one or more performance characteristics of said communications network modeled by said three dimensional environmental computer database model; and
   means for displaying, on said three-dimensional site map of said site displayed on said display, a graphical rendering of said one or more performance characteristics.

2. The system of claim 1 wherein said graphical rendering produced by said means for displaying provides color variations indicative of differences in said one or more performance characteristics at different locations in said three-dimensional site map of said site.

3. The system of claim 1 wherein said graphical rendering produced by said means for displaying provides gray scale variations indicative of differences in said one or more performance characteristics at different locations in said three-dimensional site map of said site.

4. The system of claim 1 wherein said graphical rendering produced by said means for displaying provides a mesh of fluctuating elevations indicative of differences in said one or more performance characteristics at different locations in said three-dimensional site map of said site.

5. The system of claim 1 wherein said three-dimensional site map displays at least a portion of at least one floor plan of at least one floor of at least one building.

6. The system of claim 1 wherein said performance characteristic, of which said graphical rendering is displayed by said means for displaying is selected from the group consisting of radio signal strength intensity, network throughput, bit error rate, frame error rate, signal-to-interference ratio, signal-to-noise ratio, frame resolution per second, traffic, capacity, signal strength, throughput, error rates, packet latency, packet jitter, symbol jitter, quality of service, security, coverage area, bandwidth, packet error rate, round trip time, signal level, interference level, quality of service, signal loss, data loss, number of users serviced, user density, area of adequate coverage, handoff locations, area of adequate throughput, Ec/Io, system performance parameters, equipment price, maintenance and cost information, all in either absolute or relative terms.

7. The system of claim 1 further comprising a means for outputting cost information based on cost data of said one or more components selected by said means for selecting.

8. The system of claim 7 wherein the cost data is selected from the group consisting of equipment cost, installation cost, and maintenance cost, and combinations thereof.

9. The system of claim 1 wherein said means for positioning positions said one or more components in three dimensions on said site map.

10. The system of claim 9 wherein said means for positioning allows determining an orientation of one or more components at one or more locations on said site map.

11. The system of claim 1 wherein said means for selecting comprises a means for displaying a listing of said computer representations and a means for pointing and clicking on one or more of said computer representations in said listing.

12. The system of claim 11 wherein said means for selecting operates in conjunction with a pull down menu.

13. The system of claim 1 wherein said means for selecting comprises a sorting function for sorting said computer representations based on a range of acceptable performance criteria.

14. The system of claim 1 wherein said means for selecting comprises a sorting function for sorting said computer representations based on a range of cost criteria.

15. The system of claim 1 wherein said means for positioning comprises a point-and-click feature for positioning said one or more components in said site map.

16. The system of claim 1 further comprising a means for changing a component selected by said means for selecting, changes resulting from said means for changing being reflected in said performance characteristics calculated by said means for calculating.

17. The system of claim 1 further comprising a means for changing a position of a component within said site map from a previous position determined by said means for positioning, changes resulting from said means for changing a position being reflected in said performance characteristics calculated by said means for calculating.

18. The system of claim 1 further comprising a means for changing an orientation of a component within said site map from a previous orientation determined by said means for positioning, changes resulting from said means for changing an orientation being reflected in said performance characteristics calculated by said means for calculating.

19. The system of claim 1 wherein said means for calculating comprises one or more predictive models and a means for selecting at least one of said predictive models for calculating said performance characteristics.

20. The system of claim 19 wherein said one or more predictive models comprises one of more of the following parameters RSSI, C11, C/N, received power, antenna gain, body loss, noise figure, height above floor, partition attenuation factors, floor attenuation factors, path loss exponents, multiple breakpoints, reflectivity, surface roughness, antenna patterns, signal loss factors, propagation loss factors, noise level, throughput prediction model parameters, height above ground, floor number, Ec/Io, attenuation, and antenna polarization, all in either absolute or relative terms.

21. The system of claim 1 further comprising a means for designating one or more watch points within said site map, and means for determining one or more performance characteristics at said one or more watch points.

22. The system of claim 21 wherein said one or more performance characteristics are displayed on said site map at said one or more watch points.

23. The system of claim 21 further comprising a means for moving said one or more watch points, wherein said means for calculating and said means for displaying provide results which consider a change made by said means for moving.

24. The system of claim 23 further comprising a means to move said one or more watch points in real time.

25. The system of claim 1 further comprising a means for interconnecting at least two components positioned by said means for positioning and displaying an interconnection between said two components.

26. The system of claim 25 further comprising a means for changing an interconnection between at least two components, wherein said means for calculating and said means for displaying provide results which consider a change made by said means for changing.

27. The system of claim 25 wherein said means for interconnecting comprises a point-and-click feature.

28. The system of claim 25 wherein said means for interconnecting operates in conjunction with a pull down window.

29. A method for modeling a communications network, comprising:
    providing a three dimensional environmental computer database model of a site where a communications network may be deployed;
    displaying a three-dimensional site map of said site, the three-dimensional site map including non-network elements;
    selecting computer representations of one or more components which may be used in said communications network from amongst a database of computer representations of components, said computer representations of each of said one or more components comprising performance data;
    positioning said one or more components on said three-dimensional site map of said site;
    calculating one or more performance characteristics of said communications network modeled by said three dimensional environmental computer database model; and
    displaying, on said three-dimensional site map, a graphical rendering of said one or more performance characteristics.

30. The method of claim 29 wherein said graphical rendering provides color variations indicative of differences in said one or more performance characteristics at different locations in said three-dimensional site map of said site.

31. The method of claim 29 wherein said graphical rendering provides gray scale variations indicative of differences in said one or more performance characteristics at different locations in said three-dimensional site map of said site.

32. The method of claim 29 wherein said graphical rendering provides a mesh of fluctuating elevations indicative of differences in said one or more performance characteristics at different locations in said three-dimensional site map of said site.

33. The method of claim 29 wherein said three-dimensional site map displays at least a portion of at least one floor plan of at least one floor of at least one building.

34. The method of claim 29 wherein said performance characteristic rendered in said graphical rendering is selected from the group consisting of radio signal strength intensity, network throughput, bit error rate, frame error rate, signal-to-interference ratio, signal-to-noise ratio, frame resolution per second, traffic, capacity, signal strength, throughput, error rates, packet latency, packet jitter, symbol jitter, quality of service, security, coverage area, bandwidth, packet error rate, round trip time, signal level, interference level, quality of service, signal loss, data loss, number of users serviced, user density, area of adequate coverage, handoff locations, area of adequate throughput, Ec/Io, system performance parameters, equipment price, maintenance and cost information, all in either absolute or relative terms.

35. The method of claim 29 further comprising the step of outputting cost information based on cost data of said one or more components selected.

36. The method of claim 29 wherein said positioning step positions said one or more components in three dimensions on said site map.

37. The method of claim 29 wherein said positioning step allows determining an orientation of one or more components at one or more locations on said site map.

38. The method of claim 29 wherein said selecting step comprises the steps of displaying a listing of said computer representations and pointing and clicking on one or more of said computer representations in said listing.

39. The method of claim 38 wherein said selecting step operates in conjunction with a pull down menu.

40. The method of claim 29 wherein said selecting step comprises a sorting function for sorting said computer representations based on a range of acceptable performance criteria.

41. The method of claim 29 wherein said selecting step comprises a sorting function for sorting said computer representations based on a range of cost criteria.

42. The method of claim 29 wherein said positioning step utilizes a point-and-click feature for positioning said one or more components in said site map.

43. The method of claim 29 further comprising the step of changing a component selected in said selection step, wherein changes are reflected in said performance characteristics calculated in said calculating step.

44. The method of claim 29 further comprising the step of changing a position of a component within said site map from a previous position, wherein changes are reflected in said performance characteristics calculated in said calculating step.

45. The method of claim 29 further comprising the step of changing an orientation of a component within said site map from a previous orientation, wherein changes are reflected in said performance characteristics calculated in said calculating step.

46. The method of claim 29 wherein said calculating step comprises selecting one or more predictive models for calculating said performance characteristics.

47. The method of claim 46 wherein said one or more predictive models comprise one of more of the following parameters: RSSI, C/I, C/N, received power, antenna gain, body loss, noise figure, height above floor, partition attenuation factors, floor attenuation factors, path loss exponents, multiple breakpoints, reflectivity, surface roughness, antenna patterns, signal loss factors, propagation loss factors, noise level, throughput prediction model parameters, height above ground, floor number, Ec/Io, attenuation, and antenna polarization, all in either absolute or in relative terms.

48. The method of claim 29 further comprising the steps of designating one or more watch points within said site map, and determining one or more performance characteristics at said one or more watch points.

49. The method of claim 48 wherein said one or more performance characteristics are displayed on said site map at said one or more watch points.

50. The method of claim 48 further comprising a means for moving said one or more watch points, wherein said means for calculating and said means for displaying provide results which consider a change made by said means for moving.

51. The method of claim 29 further comprising the steps of interconnecting at least two components positioned in said positioning step, and displaying an interconnection between said two components.

52. The method of claim 51 further comprising the step of charging an interconnection between at least two components, wherein said calculating step and said displaying step provide results which consider a change made in said changing step.

53. The method of claim 51 wherein said step of interconnecting utilizes a point-and-click feature.

54. The method of claim 51 wherein said step of interconnecting operates in conjunction with a pull down window.

55. A system for modeling a communications network, comprising:
  a three dimensional environmental computer database model of a site including non-network elements where a communications network may be deployed with computer representations of one or more components which may be used in the communications network positioned within a site map of said site, said computer representations of said one or more components being selectable from a database which comprises a plurality of computer representations wherein each of said computer representations comprises performance characteristics;
  a display for displaying a three-dimensional site map of said site;
  means for calculating performance characteristics of said communications network modeled by said three dimensional environmental computer database model;
  means for displaying, on said three-dimensional site map of said site displayed on said display, a graphical rendering of said one or more performance characteristics; and
  means for changing
    a) a computer representation of at least one component at one or more positions within said site map of said site, or
    b) a position of a computer representation of at least one component within said site map of said site, or
    c) an orientation of a component modeled by said computer representation of at least one component within said site map of said site, or
    d) an interconnection between computer representations of at least two components.

56. The system of claim 55 further comprising a means for updating performance characteristics computed by said means for calculating when a change is made by said means for changing.

57. The system of claim 55 wherein said means for changing changes a computer representation of at least one component at one or more positions within said site map of said site.

58. The system of claim 55 wherein said means for changing changes a position of a computer representation of at least one component within said site map of said site.

59. The system of claim 55 wherein said means for changing changes an orientation of a component modeled by said computer representation of at least one component within said site map of said site.

60. The system of claim 55 wherein said means for changing changes an interconnection between computer representations of at least two components.

61. The system of claim 55 wherein said means for calculating comprises one or more predictive models and a means for selecting at least one of said predictive models for calculating said performance characteristics.

62. The system of claim 61 wherein said one or more predictive models comprises one of more of the following parameters: RSSI, CA, C/N, received power, antenna gain, body loss, noise figure, height above floor, partition attenuation factors, floor attenuation factors, path loss exponents, multiple breakpoints, reflectivity, surface roughness, antenna patterns, signal loss factors, propagation loss factors, noise level, throughput prediction model parameters, height above ground, floor number, Ec/Io, attenuation and antenna polarization, all in either absolute or in relative terms.

63. The system of claim 55 wherein each of said computer representations comprises cost information.

64. The system of claim 63 wherein said cost information comprises a purchase price of at least one component of said one or more components.

65. The system of claim 63 wherein said cost information comprises an installation cost of at least one component of said one or more components.

66. The system of claim 63 wherein said cost information comprises a maintenance cost of at least one component of said one or more components.

67. The system of claim 55 wherein said performance characteristic, of which said graphical rendering is displayed by said means for displaying, is selected from the group consisting of radio signal strength intensity, network throughput, bit error rate, frame error rate, signal-to-interference ratio, signal-to-noise ratio, frame resolution per second, traffic, capacity, signal strength, throughput, error rates, packet latency, packet jitter, symbol jitter, quality of service, security, coverage area, bandwidth, packet error rate, round trip time, signal level, interference level, quality of service, signal loss, data loss, number of users serviced, user density, area of adequate coverage, handoff locations, area of adequate throughput, Ec/Io, system performance parameters, equipment price, maintenance and cost information, all in either absolute or in relative terms.

68. The system of claim 55 further comprising a means for designating one or more watch points within said site map, and means for determining one or more performance characteristics at said one or more watch points.

69. The system of claim 68 wherein said one or more performance characteristics are displayed on said site map at said one or more watch points.

70. The system of claim 68 further comprising a means for moving said one or more watch points.

71. The system of claim 70 wherein said means for moving said one or more watch points operates in real time.

72. A method for modeling a communications network, comprising:
  providing a three dimensional environmental computer database model of a site where a communication s network may be deployed with computer representations of one or more components which may be used in the communications network positioned within a site map of said site, said computer representations of said one or more components being selectable from a database which comprises a plurality of computer representation s wherein each of said computer representations comprises performance characteristics;
  displaying a three-dimensional site map of said site, the three-dimensional site map including non-network elements;

calculating performance characteristics of said communications network modeled by said three dimensional environmental computer database model;

displaying on said three-dimensional site map a graphical rendering of said one or more performance characteristics; and changing at least one of a) a computer representation of at least one component at one or more positions within said site map of said site, or b) a position of a computer representation of at least one component within said site map of said site, or c) an orientation of a component modeled by said computer representation of at least one component within said site map of said site; or d) an interconnection between computer representations of at least two components.

73. The method of claim 72 further comprising the step of updating performance characteristics of said calculating step when a change is made in said changing step.

74. The method of claim 72 wherein said changing step changes a computer representation of at least one component at one or more position within said site map of said site.

75. The method of claim 72 wherein said changing step changes a position of a computer representation of at least one component within said site map of said site.

76. The method of claim 72 wherein said changing step changes an orientation of a component modeled by said computer representation of at least one component within said site map of said site.

77. The method of claim 72 wherein said changing step changes an interconnection between computer representations of at least two components.

78. The method of claim 72 further comprising the step of designating one or more watch points within said site map, and determining one or more performance characteristics at said one or more watch points.

79. The method of claim 78 wherein said one or more performance characteristics are displayed on said site map at said one or more watch points.

80. The method of claim 78 further comprising the step of moving said one or more watch points.

81. The method of claim 80 wherein said step of moving said one or more watch points is performed in real time.

82. The method of claim 72 wherein said calculating step comprises the step of selecting from amongst a plurality of predictive models at least one of said predictive models for calculating said performance characteristics.

83. The method of claim 82 wherein said one or more predictive models comprises one of more of the following parameters: RSSI, C/I, C/N, received power, antenna gain, body loss, noise figure, height above floor, partition attenuation factors, floor attenuation factors, path loss exponents, multiple breakpoints, reflectivity, surface roughness, antenna patterns, signal loss factors, propagation loss factors, noise level, throughput prediction model parameters, height above ground, floor number, EC/Io, attenuation, and antenna polarization, all in either absolute or in relative terms.

84. The method of claim 72 wherein each of said computer representations has cost information associated therewith, and further comprising the step of displaying said cost information.

85. The method of claim 84 wherein said cost information comprises a purchase price of at least one component of said one or more components.

86. The method of claim 85 wherein said cost information is selected from the group consisting of equipment cost, installation cost, and maintenance cost, and combinations thereof.

87. The method of claim 84 wherein said cost information comprises an installation cost of at least one component of said one or more components.

88. The method of claim 84 wherein said cost information comprises a maintenance cost of at least one component of said one or more components.

89. The method of claim 72 wherein said performance characteristic, of which said graphical rendering is displayed in said displaying step, is selected from the group consisting of radio signal strength intensity, network throughput, bit error rate, frame error rate, signal-to-interference ratio, signal-to-noise ratio, frame resolution per second, traffic, capacity, signal strength, throughput, error rates, packet latency, packet jitter, symbol jitter, quality of service, security, coverage area, bandwidth, packet error rate, round trip time, signal level, interference level, quality of service, signal loss, data loss, number of users serviced, user density, area of adequate coverage, handoff locations, area of adequate throughput, Ec/Io, system performance parameters, equipment price, maintenance and cost information, all in either absolute or in relative terms.

* * * * *